United States Patent [19]
Turner et al.

[11] Patent Number: 6,048,781
[45] Date of Patent: Apr. 11, 2000

[54] SEMICONDUCTOR PROCESSING METHOD FOR PROVIDING LARGE GRAIN POLYSILICON FILMS

[75] Inventors: Charles L. Turner, Chandler, Ariz.; Monte Manning, Kuna, Id.

[73] Assignee: Micron Technology, Inc., Boise, Id.

[21] Appl. No.: 09/095,772

[22] Filed: Jun. 10, 1998

Related U.S. Application Data

[63] Continuation of application No. 08/657,816, May 31, 1996, Pat. No. 5,792,700.

[51] Int. Cl.$^7$ .................................................. H01L 21/20
[52] U.S. Cl. ........................ 438/486; 438/487; 438/505
[58] Field of Search .................................. 438/166, 486, 438/487, 488, 491, 501, 505, 508

[56] References Cited

U.S. PATENT DOCUMENTS

| | | | |
|---|---|---|---|
| 5,183,777 | 2/1993 | Doki et al. | 437/160 |
| 5,242,507 | 9/1993 | Iverson | 438/486 |
| 5,310,698 | 5/1994 | Wild | 437/160 |
| 5,491,107 | 2/1996 | Turner et al. | 437/162 |
| 5,529,937 | 6/1996 | Zhang et al. | 117/8 |
| 5,531,182 | 7/1996 | Yonehara | 117/7 |
| 5,532,183 | 7/1996 | Sugawara | 438/486 |
| 5,597,741 | 1/1997 | Sakamoto et al. | 438/486 |
| 5,923,997 | 7/1999 | Mitanga et al. | 438/486 |
| 5,930,658 | 7/1999 | Ibok | 438/482 |
| 5,960,323 | 9/1999 | Wakita et al. | 438/795 |
| 5,976,918 | 11/1999 | Matsuoka et al. | 438/149 |
| 5,985,741 | 11/1999 | Yamazaki et al. | 438/486 |
| 5,994,164 | 11/1999 | Fonash et al. | 438/97 |

FOREIGN PATENT DOCUMENTS

| | | | |
|---|---|---|---|
| 631325 | 12/1994 | European Pat. Off. . | |
| 639856A1 | 2/1995 | European Pat. Off. | 438/FOR 269 |
| 3504184 | 8/1986 | Germany | 437/233 |
| 0005518 | 1/1988 | Japan | 437/160 |
| 0166220 | 7/1988 | Japan | 437/160 |
| 4-78172 | 3/1992 | Japan | 438/FOR 484 |
| 5-129204 | 5/1993 | Japan | 438/FOR 478 |
| 5-144730 | 6/1993 | Japan | 438/FOR 206 |
| 2171844 | 9/1986 | United Kingdom | 438/FOR 269 |

OTHER PUBLICATIONS

T. Noguchi et al. Jpn. J. Appl. Phys., 24(6)(1985)L434 "Grain growth ... of super thin polysilicon films ... ", Jun. 1985.

G. Chaussemy et al., Phys. Stat. Sol. A124 (1991) 103 "RTA of arsenic implanted monocrystalline silicon: dopant redistribution and outdiffusion", 1991 month unknown.

H. Kerkow et al., Phys. Stat. Sol. A76 (1983) K203 "Kinetics of furnace annealing of As–implanted Si", 1983 month unknown.

(List continued on next page.)

*Primary Examiner*—Richard T. Elms
*Assistant Examiner*—Michael S. Lebentritt
*Attorney, Agent, or Firm*—Wells, St. John, Roberts, Gregory & Matkin, P.S.

[57] ABSTRACT

A semiconductor processing method of providing a polysilicon layer atop a semiconductor wafer comprises the following sequential steps: a) depositing a first layer of arsenic atop a semiconductor wafer; b) depositing a second layer of silicon over the arsenic layer, the second layer having an outer surface; c) first annealing the wafer at a temperature of at least about 600° C. for a time period sufficient to impart growth of polycrystalline silicon grains in the second layer and providing a predominately polysilicon second layer, the first annealing step imparting diffusion of arsenic within the second layer to promote growth of large polysilicon grains; and d) with the second layer outer surface being outwardly exposed, second annealing the wafer at a temperature effectively higher than the first annealing temperature for a time period sufficient to outgas arsenic from the polysilicon layer. As an alternate consideration, the layer of silicon could be in situ provided with an effective quantity of As during deposition.

1 Claim, 1 Drawing Sheet

OTHER PUBLICATIONS

C.V. Thomoson, "Grain Growth in Polycrysatalline Silicon Films", Dept. of Materials Science and Engineering Massachusetts Institute of Technology, Cambridge, MA. Mat.Res. Soc. Symp. Proc. vol. 106, 1988.

Gorkum et al., "Controlled Atomic Layer Doping and ALD MOSFET Fabrication in Si", Japanese Journal of Applied Physics, vol. 26, No. 12, pp. L1933–1935, Dec. 1987.

Gong et al., "A Metal–Oxide–Silicon Field–Effect Transistor Made by Means of Solid–Phase Doping", J. Appl. Phy., 65 (11), pp. 4435–4437, Jun. 1989.

Aoyama et al., "Leakage Currents Reduction of Poly–Si TFT's by Two Step Annealing", Extended Abstracts of the 22nd (1990 International) Conference on Sol. St. Dev. and Materials, pp. 389–392.

Translation of JP5–129204, May 1993.

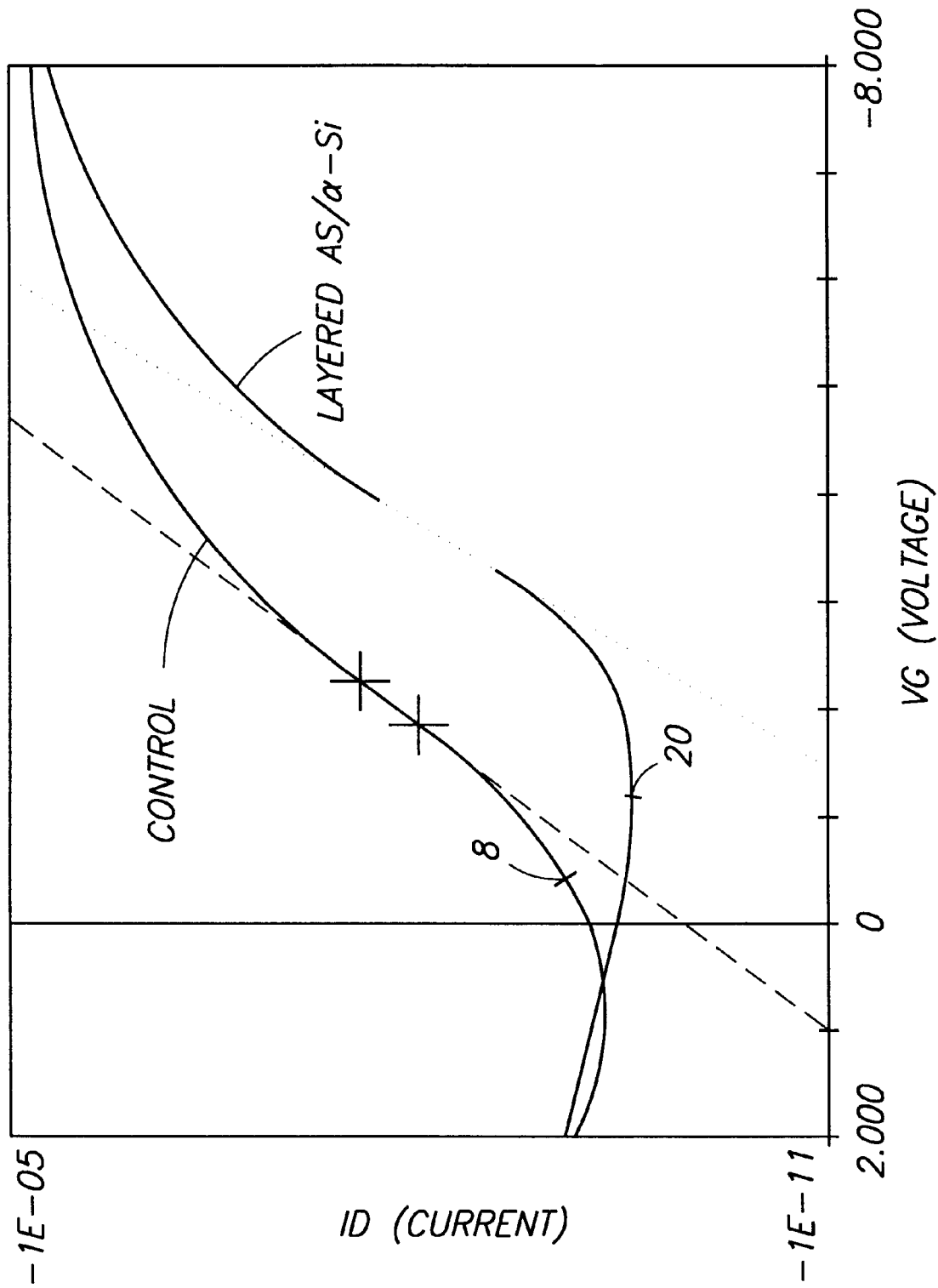

SEMICONDUCTOR PROCESSING METHOD FOR PROVIDING LARGE GRAIN POLYSILICON FILMS

RELATED PATENT DATA

This application is a continuation application of Ser. No. 08/657,816, which was filed on May 31, 1996, now U.S. Pat. No. 5,792,700.

TECHNICAL FIELD

This invention relates generally to polysilicon layers in semiconductor wafer processing, and more particularly to increasing or enhancing the size of polysilicon grains within a polysilicon layer.

BACKGROUND OF THE INVENTION

It is desirable in formation of polysilicon films to provide large individual polysilicon grains to maximize resultant conductance upon impurity doping. The desire for large polysilicon grains is even greater in fabrication of thin-film-transistors (commonly referred to as "TFTs") which typically have a thickness of from about 100 Angstroms to around 2000 Angstroms.

Polysilicon can be provided atop a semiconductor wafer by direct deposition or deposition of amorphous polysilicon followed by a crystallization anneal. Another technique employs "recrystallization" of a polysilicon film, whether that film be polycrystalline as deposited or initially rendered so by a post-amorphous deposition anneal. "Recrystallization" refers to the nucleation and growth of new grains within a preexisting crystalline matrix that has been made amorphous, or to grain enlargement of preexisting grains. It is typically undesirable to directly deposit polysilicon, as such deposition inherently results in very small grains, large numbers of grain boundaries, and other undesired defects. Grain growth and size can be maximized by amorphous silicon deposition followed by crystallization anneal, or by recrystallization techniques. Larger grains result from these processes as opposed to mere direct deposition of polysilicon.

This invention comprises an improved technique for enhancing or enlarging the size of polysilicon grains in a polysilicon film.

BRIEF DESCRIPTION OF THE DRAWINGS

Preferred embodiments of the invention are described below with reference to the following accompanying drawing.

FIG. 1 is a logarithmic plot of current vs. voltage for a control polysilicon thin film transistor and a polysilicon thin film transistor produced in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a polysilicon layer atop a semiconductor wafer comprises the following sequential steps:

depositing a first layer of arsenic atop a semiconductor wafer;

depositing a second layer of silicon over the arsenic layer, the second layer having an outer surface;

first annealing the wafer at a temperature of at least about 600° C. for a time period sufficient to impart growth of polycrystalline silicon grains in the second layer and providing a predominately polysilicon second layer, the first annealing step imparting diffusion of arsenic within the second layer to promote growth of large polysilicon grains; and with the second layer outer surface being outwardly exposed, second annealing the wafer for a time period sufficient to outgas arsenic from the polysilicon layer.

It is believed that the first layer of arsenic should be deposited to a thickness of less than or equal to about 20 Angstroms. Preferably, the first layer thickness can be less than or equal to about 5 Angstroms, with from about 1 Angstrom to about 2 Angstroms believed to be most preferred. The intent is to provide sufficient arsenic within the silicon layer (whether such layer be amorphous silicon or polycrystalline silicon) to enhance or promote an increase in the size of individual polysilicon grains grown within the silicon layer during the first annealing step. It is believed that the quantity of arsenic atoms within the silicon layer should be at least about $1 \times 10^{17}$ atoms/cm$^3$, with a concentration of from about $1 \times 10^{19}$ atoms/cm$^3$ to about $1 \times 10^{20}$ atoms/cm$^3$ being most preferred. It has been discovered that an essentially directly immeasurable thick layer of arsenic, less than 2 Angstroms for a 600 Angstrom thick amorphous Si film, produces a desired effect of large grain growth as evidenced by an increase in slope on a logarithmic plot of current vs. voltage. Such represents faster voltage on/voltage off switching, evidencing an increase in grain size.

Arsenic is an n-type dopant material capable in sufficient quantities of desirably rendering a polysilicon region electrically conductive. However, the preferred $10^{19}$ to $10^{20}$ concentration levels are excessive and typically would be undesired high concentrations in a finished polysilicon layer used for thin film transistors, or for p+ doped polysilicon. More typical desired concentrations of dopant material for thin film transistors are from about $1 \times 10^{15}$ atoms/cm$^3$ to about $1 \times 10^{17}$ atoms/cm$^3$.

The arsenic layer would typically be deposited by low pressure chemical vapor deposition (LPCVD) at a temperature greater than 450° C. and a pressure from 1 mTorr to 1 Torr. Amorphous silicon can be deposited by LPCVD techniques at temperatures less the 585° C., while polycrystalline silicon (polysilicon) can be directly deposited by LPCVD techniques at temperatures greater than 550° C.

The invention is expected to have its greatest advantageous application in situations where grain size is the most critical, that being with respect to very thin polysilicon layers such as utilized in thin film transistor technology. The thickness of the thin films for such transistors is typically from about 100 Angstroms to about 2000 Angstroms. About 450 Angstroms is presently typical for SRAM applications. Aspects of the invention in promoting the size of individual polysilicon grain growth will become even more important as thinner polysilicon films are utilized in the next generation levels of miniaturization.

Amorphous/polycrystalline phase changes in silicon typically occur at a processing temperature of around 585° C. Accordingly, an annealing of an amorphous silicon layer for a sufficient period of time above this temperature, such as at least about 600° C., will crystallize an amorphous silicon layer into polysilicon. The amount of time necessary for such crystallization depends upon the temperature employed, and the thickness of the amorphous silicon film being treated. Where the film is to be utilized for a thin film transistor, having a thickness of from about 300 Angstroms to about 400 Angstroms, a temperature of about 600° C. is preferred, with exposure to such temperature for approximately 12 hours being sufficient to result in the crystallization. Higher temperatures would require less time. During such an annealing step, arsenic atoms will diffuse into and throughout the silicon layer and thereby impart growth of large polysilicon grains.

"Recrystallization" of a layer of polycrystalline silicon as-deposited will occur at higher temperatures, such as 950° C. for thirty minutes. During such an annealing step, arsenic would diffuse from the arsenic layer to and within the second layer to promote growth of large polysilicon grains. To prevent outgasing of such arsenic during such first annealing step, a masking material can be provided atop the silicon layer. Example masking materials would be oxides and nitrides.

It is not believed that appreciable arsenic diffuses into the silicon layer during its deposition, but rather that diffusion into such layer occurs during the crystallization or recrystallization anneals.

FIG. 1 illustrates a comparison between a control polysilicon film and a film processed in accordance with the invention. Such a graph represents a logarithmic plot of drain current versus gate voltage for such films. The control film was initially deposited to a thickness of from about 400 Angstroms to about 500 Angstroms, and was undoped and amorphous as deposited. It was crystallized at a temperature of about 600° C. for 24 hours. The crystallized film was then doped with phosphorus at a dose of $5 \times 10^{12}$. The layered (inventive) film was provided by first depositing a thin layer of arsenic under LPCVD conditions for 30 minutes. Next, silicon was deposited under LPCVD conditions at less than 585° C. to a thickness of from about 400 Angstroms to about 500 Angstroms, such that an amorphous silicon layer resulted. The wafer with amorphous silicon layer was annealed at about 600° C. for 24 hours to impart crystallization.

With the outer surface of the crystallized layer being outwardly exposed, a second anneal of the wafer is conducted for a time period sufficient to outgas arsenic from the polysilicon layer. Example conditions would be 907° C. for approximately 30 minutes. Lower temperatures could be utilizable for longer periods of time to sufficiently outgas the arsenic from the polysilicon layer. Such lower temperatures would, however, be greater than 600° C. The 600° C. crystallization step would result in very little, if any, outgasing of arsenic from the polysilicon. Where the silicon layer is first annealed at around 600°, the second annealing temperature will be effectively higher than the first annealing temperature. Where the silicon layer is first annealed at say 950° C. with an oxide cap, such as say for polysilicon recrystallization with arsenic, the second annealing temperature will not necessarily by greater than the first annealing temperature. The oxide capping layer deposited to prevent outgasing during the first anneal would be removed prior to the second anneal.

Ultimate removal of arsenic from the polysilicon is desired to enable a p-type implant to be provided. Even where n-type polysilicon is desired, the arsenic concentration imparted from the first layer would typically be excessively high and undesirable for thin film transistors. The second annealing temperature is preferably greater than about 900° C., enabling process time to be reduced, and therefor throughput to be maximized.

It will be noted from FIG. 1 that the slope of the curves of the respective films improves from 883 mV/dec (silicon deposition only) to 690 mV/dec (arsenic/silicon layered film). Such represents faster voltage on/voltage off switching, evidencing an increase in grain size. Also, the "off current" is reduced from 20 pA to 8 pA for such films. Such would be especially significant for thin film transistors for SRAM load applications, where the slope and the "off current" is an important parameter. There, the "off current" sets the "stand-by current" of the chip, and the slope ultimately determines the "on current" at Vg=Vd=Vcc.

Sheet resistance of the resultant films was also measured, with the arsenic/Si layered film having a sheet resistance factor of two lower than that for the control film. Further, Gm (maximum conductance of the thin film transistor) was a factor of two higher for the layered film. Both of these facts indicate a larger and more defective-free grain for the arsenic/silicon layered film.

In accordance with another aspect of the invention, a semiconductor processing method of providing a polysilicon layer atop a semiconductor wafer comprises the following sequential steps:

depositing a layer of substantially amorphous silicon atop a semiconductor wafer, such depositing step including exposing the wafer to arsenic during such deposition to in situ dope the amorphous silicon layer with arsenic to a concentration of at least about $1 \times 10^{17}$ arsenic atoms/cm$^3$, the layer of in situ doped amorphous silicon having an outer surface;

first annealing the wafer at a temperature of at least about 600° C. for a time period sufficient to crystallize the doped amorphous layer into polysilicon, the arsenic present in the amorphous silicon layer promoting growth of large polysilicon grains during such first annealing step; and with the outer surface being outwardly exposed, second annealing the wafer for a time period sufficient to outgas arsenic from the polysilicon layer.

The first annealing and second annealing are preferably conducted in accordance with that described above in accordance with the first aspect of the invention. In situ provision of arsenic within the amorphous silicon layer during its deposition would also inherently provide arsenic presence in the silicon layer to enhance grain grown, with such arsenic being later driven from the polysilicon layer. Example conditions for such in situ doping and deposition would include injecting arsine and silane into an LPCVD reactor at greater than 1 Torr and at a temperature of less than 585° C.

In accordance with yet another aspect of the invention, a semiconductor processing method of providing a polysilicon layer atop a semiconductor wafer comprising the following sequential steps:

depositing a layer of polycrystalline silicon atop a semiconductor wafer, such depositing step including exposing the wafer to arsenic during such deposition to in situ dope the polycrystalline silicon layer with arsenic to a concentration of at least about $1 \times 10^{17}$ arsenic atoms/cm$^3$, the layer of in situ doped polycrystalline silicon having an outer surface;

masking the outer polycrystalline silicon surface;

first annealing the wafer at a temperature of at least about 950° C. for a time period sufficient to impart growth of polycrystalline silicon grains in the polycrystalline silicon layer, the arsenic present in the masked polycrystalline silicon layer promoting growth of large polysilicon grains during such first annealing step;

removing the masking from the outer polycrystalline silicon surface; and with the outer surface being outwardly exposed, second annealing the wafer for a time period sufficient to outgas arsenic from the polysilicon layer.

Processing could otherwise proceed as described above with respect to the first two described aspects of the invention, with the masking material being an oxide or a nitride sufficient to prevent the out diffusion during the stated first annealing. First annealing temperature and time could be 950° C. and 30 or more minutes, respectively, by way of example.

A most significant advantage of this invention is believed to be that it provides an alternate and more effective route for producing large grains and passivation of grain boundaries in a polycrystalline film. Even prior art techniques which produce polysilicon films require a passivation-like step to eliminate defects, such as stacking faults, dislocations, microtwins, and dangling bonds. Such passivation-like steps typically comprise treatment of the wafer with hydrogen which fundamentally eliminates dangling bonds, but does not provide significant improvement to other such problems. Grain growth in the presence of arsenic apparently significantly reduces such other defects.

A second advantage of the invention is the improving of the interface between the resultant polysilicon film and the typical underlying gate oxide. The invention results in better transconductance, lower sheet resistance, better sub-threshold slope, and lower "off current" than current technology. The invention as well has the capability of reducing cycling time by eliminating separate passivation-like steps from the typical process flow.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of providing a polysilicon layer atop a semiconductor wafer comprising the following sequential steps:

depositing a first layer of arsenic atop the semiconductor wafer to a thickness of less than about 5 Angstroms, the first layer of arsenic deposited at a temperature of greater than about 450 degrees C. and a pressure of about 1 mTorr to about 1 Torr;

after depositing the first layer of arsenic, depositing a second layer of amorphous silicon over the first layer of arsenic at a temperature of less than about 585 degrees C. and to a thickness of less than about 2000 Angstroms, the second layer of amorphous silicon having a substantially unoxidized outer surface and a given grain size;

after depositing the second layer of amorphous silicon, providing a masking layer atop the exposed unoxidized outer surface of the second layer of amorphous silicon to a thickness effective to substantially prohibit outgasing of the first layer of arsenic;

after providing the masking layer, conducting a first annealing of the semiconductor wafer at a temperature of at least about 600 degrees C. for a time period sufficient to encourage diffusion of the first layer of arsenic within the second layer of amorphous silicon and to subsequently increase the size of the grains in the second layer of amorphous silicon during the first annealing step, the amorphous silicon layer crystallizing during the first annealing step into polysilicon;

after the first annealing, removing the masking layer thereby exposing the unoxidized outer surface of the second layer of polysilicon; and after removing the masking layer and with the substantially unoxidized outer surface exposed, conducting a second in time annealing of the semiconductor wafer for a time period sufficient to substantially outgas the arsenic from the second layer of polysilicon, the outgasing of the arsenic from the second layer of polysilicon increasing the resistance of the second layer of polysilicon.

* * * * *